(12) United States Patent
Kawaguchi et al.

(10) Patent No.: US 8,540,925 B2
(45) Date of Patent: Sep. 24, 2013

(54) PHOTOCURABLE COMPOSITION, MICROPATTERN-FORMED PRODUCT AND ITS PRODUCTION PROCESS

(75) Inventors: Yasuhide Kawaguchi, Yokohama (JP); Akihiko Asakawa, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 1046 days.

(21) Appl. No.: 11/876,182

(22) Filed: Oct. 22, 2007

(65) Prior Publication Data

US 2008/0107870 A1    May 8, 2008

Related U.S. Application Data

(63) Continuation of application No. PCT/JP2006/305739, filed on Mar. 22, 2006.

(30) Foreign Application Priority Data

Apr. 21, 2005  (JP) .................................. 2005-123583
Jun. 27, 2005  (JP) .................................. 2005-186742

(51) Int. Cl.
| | |
|---|---|
| *B28B 1/14* | (2006.01) |
| *B29C 35/08* | (2006.01) |
| *B29C 39/00* | (2006.01) |
| *B29C 41/00* | (2006.01) |
| *C07C 19/08* | (2006.01) |
| *C07C 21/18* | (2006.01) |
| *C07C 23/00* | (2006.01) |
| *C08F 2/50* | (2006.01) |

(52) U.S. Cl.
USPC ............... 264/496; 264/299; 522/6; 570/124

(58) Field of Classification Search
None
See application file for complete search history.

(56) References Cited

U.S. PATENT DOCUMENTS

| | | | | |
|---|---|---|---|---|
| 2,468,664 | A | * | 4/1949 | Hanford et al. ............... 526/221 |
| 5,439,621 | A | * | 8/1995 | Hoopman ...................... 264/2.5 |
| 6,124,404 | A | | 9/2000 | Enokida et al. |
| 6,334,960 | B1 | | 1/2002 | Willson et al. |
| 6,482,742 | B1 | | 11/2002 | Chou |
| 7,060,774 | B2 | | 6/2006 | Sparrowe et al. |
| 2002/0102490 | A1 | * | 8/2002 | Ito et al. ..................... 430/270.1 |
| 2003/0166814 | A1 | * | 9/2003 | Sparrowe et al. ............. 526/319 |
| 2005/0058930 | A1 | * | 3/2005 | Li et al. ...................... 430/270.1 |
| 2007/0228619 | A1 | | 10/2007 | Kawaguchi et al. |

FOREIGN PATENT DOCUMENTS

| | | |
|---|---|---|
| EP | 1 227 114 A2 | 7/2002 |
| JP | 61-31411 | 2/1986 |
| JP | 10-120738 | 5/1998 |
| JP | 11-060646 | 3/1999 |
| JP | 11-181032 | 7/1999 |
| JP | 2002-105141 | 4/2002 |
| JP | 2002-539604 | 11/2002 |
| JP | 2004-2702 | 1/2004 |
| JP | 2004-504718 | 2/2004 |

OTHER PUBLICATIONS

M. Behl, J. Seekamp, S. Zankovych, C.M. Sotomayor Torres, R. Zentel, J. Ahopelto, Towards Plastic Electronics: Patterning Semiconducting Polymers by Nanoimprint Lithography, Advanced Materials, Apr. 18, 2002, vol. 14 Issue 8, pp. 588-591.*

Takuma Hojo, Mitsuru Sato and Hiroshi Komano: "Recent Progress in New Acetal-based Resist for Electron Beam Lithography". Journal of Photopolymer Science and Technology, vol. 16, pp. 455-458 (2003).*

Jason Rolland et al., "Solvent-Resistant Photocurable "Liquid Teflon" for Microfluidic Device Fabrication", J. Am. Chem. Soc. 2004, 126, pp. 2322-2323.

U.S. Appl. No. 12/888,936, filed Sep. 23, 2010, Kawaguchi.
U.S. Appl. No. 13/151,324, filed Jun. 2, 2011, Kawaguchi.

* cited by examiner

*Primary Examiner* — Benjamin Schiffman
(74) *Attorney, Agent, or Firm* — Oblon, Spivak, McClelland, Maier & Neustadt, L.L.P.

(57) ABSTRACT

A photocurable composition capable of producing a micropattern-formed product efficiently, which is excellent in physical properties such as heat resistance, chemical resistance, releasability and optical characteristics (transmittance and low refractive index), and a process for producing a micropattern-formed product, capable of highly precisely transferring a micropattern of a mold to its surface are provided.

A photocurable composition which comprises from 50 to 98 mass % of a monomer containing no fluorine atom and having a viscosity at 25° C. of from 0.1 to 100 mPa·s, from 0.1 to 45 mass % of a fluoromonomer, from more than 0.1 to 20 mass % of a fluorinated surfactant and/or a fluoropolymer and from 1 to 10 mass % of a photopolymerization initiator, and contains substantially no solvent. A process for producing a micropattern-formed product comprising a cured product having a micropattern of a mold transferred on its surface, or such a micropattern-formed product integrated with a substrate, which uses the photocurable composition, a substrate and a mold having a micropattern.

22 Claims, No Drawings

PHOTOCURABLE COMPOSITION, MICROPATTERN-FORMED PRODUCT AND ITS PRODUCTION PROCESS

TECHNICAL FIELD

The present invention relates to a photocurable composition, micropattern-formed product and its production process.

BACKGROUND ART

In recent years, attention has been drawn to a method so-called a nanoimprint method wherein a mold having a micropattern on its surface is pressed on a substrate to form a substrate having a reversed pattern of the micropattern. Particularly, attention has been drawn to a process for producing a micropattern-formed product integrated with a substrate, comprising pressing and sandwiching a photocurable composition between the surface of a substrate and a patterned surface of a mold, polymerizing a monomer in the photocurable composition by light irradiation to obtain a micropattern-formed product comprising a cured product having the micropattern of the mold transferred on its surface, and separating the mold from the cured product to obtain a micropattern-formed product integrated with the substrate (Patent Documents 1 and 2).

As the photocurable composition used in the method, a photocurable composition comprising at least one (meth)acrylate, a photopolymerization initiator and a surfactant containing a fluorinated organic silane has been known (Patent Document 3).

Patent Document 1: JP-A-2004-504718
Patent Document 2: JP-A-2002-539604
Patent Document 3: JP-A-2004-002702

DISCLOSURE OF THE INVENTION

Problems to be Solved by the Invention

Patent Document 3 merely discloses that the content of a surfactant in a photocurable composition should be sufficiently low in order to prevent phase separation of the photocurable composition, and the content is actually at most 0.1 mass %. In this case, the releasability of a cured product of the photocurable composition is insufficient, and the cured product will not be smoothly separated from a mold. Therefore, it is considered difficult to form a highly precise micropattern-formed product. Further, Patent Document 3 fails to disclose a means of increasing the content of the surfactant without causing a phase separation of the photocurable composition. Accordingly, a photocurable composition capable of efficiently producing a highly precise micropattern-formed product is desired.

Means to Solve the Problems

The present inventors have found that a composition comprising a specific monomer containing no fluorine atom, a fluoromonomer, a fluorinated surfactant and/or a fluoropolymer and a photopolymerization initiator each in a specific amount, in which these components are compatible with one another, forms a photocurable composition, and also found that a cured product of the photocurable composition can be smoothly separated from a mold. Further, the present inventors have found that a highly precise micropattern-formed product can be produced efficiently by employing the photocurable composition, a substrate and a mold having a micropattern on its surface.

Namely, the gist of the present invention is as follows.

(1): A photocurable composition which comprises from 50 to 98 mass % of a monomer containing no fluorine atom and having a viscosity at 25° C. of from 0.1 to 100 mPa·s, from 0.1 to 45 mass % of a fluoromonomer, from more than 0.1 to 20 mass % of a fluorinated surfactant and/or a fluoropolymer and from 1 to 10 mass % of a photopolymerization initiator, and contains substantially no solvent.

(2): The photocurable composition according to (1), wherein the amount of the fluoromonomer to the total amount of the fluorinated surfactant and the fluoropolymer is from 1 to 100 times by mass.

(3): The photocurable composition according to (1) or (2), which has a viscosity at 25° C. of from 0.1 to 200 mPa·s.

(4): A process for producing a micropattern-formed product, which comprises bringing the photocurable composition as defined in any one of (1) to (3) into contact with the micropatterned surface of a mold having a micropattern formed on the surface, photo-curing the photocurable composition in a state where it is in contact with the surface of the mold, and separating a cured product of the photocurable composition from the mold.

(5): A process for producing a micropattern-formed product, which comprises carrying out the following steps A, B, C and as the case requires, step D, in this order using the photocurable composition as defined in any one of (1) to (3), a substrate and a mold having a micropattern on its surface to obtain a micropattern-formed product having a micropattern on its surface or such a micropattern-formed product integrated with the substrate:

step A: a step of sandwiching and pressing the photocurable composition between the surface of the substrate and the patterned surface of the mold;

step B: a step of curing the photocurable composition by light irradiation to obtain a micropattern-formed product comprising a cured product having the micropattern of the mold transferred on its surface;

step C: a step of separating at least one of the mold and the substrate from the cured product to obtain a micropattern-formed product, a micropattern-formed product integrated with the substrate or a micropattern-formed product integrated with the mold; and step D: a step of separating the micropattern-formed product from the mold in a case where the micropattern-formed product integrated with the mold is obtained in the step C.

(6): The process for producing a micropattern-formed product according to (4) or (5), wherein the micropattern of the mold is a micropattern having convex portions and concavo portions, and the average interval of the convex portions is from 1 nm to 500 μm.

(7): A process for producing a micropattern-formed product, which comprises bringing the photocurable composition as defined in (1) or (2) into contact with the micropatterned surface of a mold having a micropattern formed on the surface, separating the mold to produce a molded product of the photocurable composition having the micropattern of the mold transferred on its surface, and photo-curing the molded product of the photocurable composition.

(8): A process for producing a micropattern-formed product, which comprises carrying out the following steps E, F, G and as the case requires, step H, in this order using the photocurable composition as defined in (1) or (2), a substrate and a mold having a micropattern on its surface to obtain a micropattern-formed product having a micropattern on its surface or such a micropattern-formed product integrated with the substrate:

step E: a step of pressing the photocurable composition between the surface of the substrate and the patterned surface of the mold;

step F: a step of separating the mold from the photocurable composition to obtain a molded product of the photocurable composition having the micropattern of the mold transferred on its surface, integrated with the substrate;

step G: a step of curing the molded product of the photocurable composition by light irradiation to obtain a micropattern-formed product comprising a cured product having the micropattern of the mold transferred on its surface, integrated with the substrate; and step H: a step of separating the micropattern-formed product from the substrate.

(9): The process for producing a micropattern-formed product according to (8), wherein the micropattern of the mold is a micropattern having convex portions and concavo portions, and the average interval of the convex portions is from 1 nm to 500 μm.

(10): A micropattern-formed product, which is a micropattern-formed product comprising a cured product obtained by curing the photocurable composition as defined in any one of (1) to (3) and having a micropattern of convex portions and concavo portions, wherein the average interval of the convex portions is from 1 nm to 500 μm.

Effects of the Invention

Since the photocurable composition of the present invention contains a fluoromonomer having a high compatibility with a specific monomer containing no fluorine atom, a fluorinated surfactant and a fluoropolymer, even if the content of the fluorinated surfactant and/or the fluoropolymer is high, no phase separation will take place. Further, the photocurable composition of the present invention and a cured product of the photocurable composition have a high fluorine content and are excellent in releasability.

Therefore, by employing the photocurable composition of the present invention, a micropattern-formed product comprising a cured product of the photocurable composition having a micropattern of a mold highly precisely transferred on its surface can be produced efficiently. Accordingly, a highly precise nanoimprint process can be realized by the present invention.

BEST MODE FOR CARRYING OUT THE INVENTION

In this specification, unless otherwise specified, viscosity means viscosity measured at 25° C.

The photocurable composition of the present invention contains from 50 to 98 mass %, preferably from 55 to 90 mass %, particularly preferably from 60 to 85 mass %, of a monomer containing no fluorine atom and having a viscosity of from 0.1 to 100 mPa·s (hereinafter simply referred to as base monomer). Since the photocurable composition of the present invention contains at least 50 mass % of the base monomer, its viscosity can be readily adjusted to a low viscosity. The photocurable composition of the present invention preferably has a viscosity of from 1 to 200 mPa·s, particularly preferably from 1 to 100 mPa·s.

The base monomer in the present invention is not particularly limited as far as it is a monomer having a polymerizable group, and a monomer having an acryloyl group or a methacryloyl group, a monomer having a vinyl group, a monomer having an allyl group or a monomer having an oxiranyl group is preferred, and a monomer having an acryloyl group or a methacryloyl group is more preferred. The number of polymerizable groups in the base monomer is preferably from 1 to 4, more preferably 1 or 2, particularly preferably 1.

As the monomer having a polymerizable group, (meth)acrylic acid, a (meth)acrylate, (meth)acrylamide, a vinyl ether, a vinyl ester, an allyl ether, an allyl ester or a styrene compound is preferred, and a (meth)acrylate is particularly preferred. In this specification, acrylic acid and methacrylic acid are referred to as (meth)acrylic acid, an acrylate and a methacrylate are referred to as (meth)acrylate, and acrylamide and methacrylamide are referred to as (meth)acrylamide.

As a specific example of the (meth)acrylate, the following compounds are mentioned.

A mono(meth)acrylate such as phenoxyethyl (meth)acrylate, benzyl(meth)acrylate, stearyl (meth)acrylate, lauryl (meth)acrylate, 2-ethylhexyl (meth)acrylate, ethoxyethyl (meth)acrylate, methoxyethyl (meth)acrylate, glycidyl (meth)acrylate, tetrahydrofurfuryl(meth)acrylate, allyl (meth)acrylate, 2-hydroxyethyl(meth)acrylate, 2-hydroxypropyl (meth)acrylate, N,N-diethylaminoethyl (meth)acrylate, N,N-dimethylaminoethyl(meth)acrylate, dimethylaminoethyl (meth)acrylate, methyladamantyl (meth)acrylate, ethyladamantyl(meth)acrylate, hydroxyadamantyl (meth)acrylate, adamantyl(meth)acrylate or isobornyl (meth)acrylate is mentioned.

And, a di(meth)acrylate such as 1,3-butanediol di(meth)acrylate, 1,4-butanediol di(meth)acrylate, 1,6-hexanediol di(meth)acrylate, diethylene glycol di(meth)acrylate, triethylene glycol di(meth)acrylate, tetraethylene glycol di(meth)acrylate, neopentyl glycol di(meth)acrylate, polyoxyethylene glycol di(meth)acrylate or tripropylene glycol di(meth)acrylate is mentioned.

Further, a tri(meth)acrylate such as trimethylolpropane tri (meth)acrylate or pentaerythritol tri(meth)acrylate is mentioned.

Furthermore, a (meth)acrylate having at least 4 polymerizable groups such as dipentaerythritol hexa(meth)acrylate is mentioned.

As a specific example of the vinyl ether, an alkyl vinyl ether such as ethyl vinyl ether, propyl vinyl ether, isobutyl vinyl ether, 2-ethylhexyl vinyl ether or cyclohexyl vinyl ether or a (hydroxyalkyl)vinyl such as 4-hydroxylbutyl vinyl ether is mentioned.

As a specific example of the vinyl ester, a vinyl ester such as vinyl acetate, vinyl propionate, vinyl (iso)butyrate, vinyl valerate, vinyl cyclohexanecarboxylate or vinyl benzoate is mentioned.

As a specific example of the allyl ether, an alkyl allyl ether such as ethyl allyl ether, propyl allyl ether, (iso)butyl allyl ether or cyclohexyl allyl ether is mentioned.

As the monomer having an oxiranyl group, a monomer having an epoxy group, a monomer having an oxetane group or a monomer having an oxazoline group is mentioned.

A monomer having an adamantyl group is particularly preferred in view of its good compatibility with a fluoromonomer or a fluorinated surfactant. Further, triethylene glycol di(meth)acrylate, tetraethylene glycol di(meth)acrylate or neopentyl glycol di(meth)acrylate is particularly preferred in view of its good curing property.

Further, as the base monomer, one type of a base monomer may be used, or at least two types of base monomers may be used.

The molecular weight of the base monomer is preferably at least 100 and at most 500, more preferably at least 200 and at most 400.

The photocurable composition of the present invention contains from 0.1 to 45 mass % of a fluoromonomer (preferably a fluoromonomer having a viscosity at 25° C. of from 1 to 100 mPa·s), preferably from 10 to 40 mass %. Since the photocurable composition of the present invention contains a fluoromonomer having a high compatibility with a base monomer, a fluorinated surfactant and a fluoropolymer, it hardly undergoes a phase separation. Further, the photocurable composition can readily be formed into a cured product without undergoing a phase separation.

The fluoromonomer of the present invention is not particularly limited as far as it is a fluoromonomer having a polymerizable group, and a fluoromonomer having an acryloyl group or a methacryloyl group, a fluoromonomer having a vinyl group, a fluoromonomer having a fluorovinyl group, a fluoromonomer having an allyl group or a fluoromonomer having an oxiranyl group is preferred. The number of polymerizable groups in the fluoromonomer is preferably from 1 to 4, more preferably 1 or 2, particularly preferably 1.

The fluorine content in the fluoromonomer of the present invention is preferably from 40 to 70 mass %, particularly preferably from 45 to 65 mass %. The fluorine content means a ratio of the mass of fluorine atoms to the total mass of all atoms constituting the fluoromonomer.

By setting the fluorine content of the fluoromonomer to be at least 40 mass %, the releasability of a cured product will be excellent. Further, by setting the fluorine content of the fluoromonomer to be at most 70 mass %, compatibility with a photopolymerization initiator will be improved, whereby a photocurable composition can be adjusted uniformly.

The molecular weight of the fluoromonomer is preferably at least 200 and at most 5,000, more preferably at least 250 and at most 1,000.

As the fluoromonomer, one type of a fluoromonomer may be used, or at least two types of fluoromonomers may be used.

As the fluoromonomer, a monomer represented by the following (1) or (2) is preferred.

(1) a compound represented by the formula $CF_2=CR^1$-Q-$CR^2=CH_2$ (wherein each of $R^1$ and $R^2$ which are independent of each other, is a hydrogen atom, a fluorine atom, a $C_{1-3}$ alkyl group or a $C_{1-3}$ fluoroalkyl group, Q is an oxygen atom, a group represented by the formula —$NR^3$— (wherein $R^3$ is a hydrogen atom, a $C_{1-6}$ alkyl group, an alkylcarbonyl group or a tosyl group) or a bivalent organic group which may have a functional group, and the same applies hereinafter).

(2) a compound represented by the formula $(CH_2=CXCOO)_nR^F$ (wherein n is an integer of from 1 to 4, X is a hydrogen atom, a fluorine atom, a methyl group or a trifluoromethyl group, and $R^F$ is a $C_{1-30}$ n-valent fluorinated organic group).

In a case where Q in the compound represented by the is formula $CF_2=CR^1$-Q-$CR^2=CH_2$ is a bivalent organic group, preferred is such a group that the main chain is a group selected from a group consisting of methylene, dimethylene, trimethylene, tetramethylene, oxymethylene, oxydimethylene, oxytrimethylene and dioxymethylene, and a hydrogen atom in the main chain is substituted by a fluorine atom, a hydroxyl group, a $C_{1-6}$ alkyl group, a $C_{1-6}$ hydroxyalkyl group, a $C_{1-6}$ alkyl group having an etheric oxygen atom inserted between carbon atom-carbon atom and a $C_{1-6}$ hydroxyalkyl group having an etheric oxygen atom inserted between carbon atom-carbon atom, and at least one hydrogen atom forming a carbon atom-hydrogen atom bond in the group is substituted by a fluorine atom. Among them, —$CF_2C(CF_3)(OH)CH_2$—, —$CF_2C(CF_3)(OH)$—, —$CF_2C(CF_3)(OCH_2OCH_3)CH_2$—, —$CH_2CH(CH_2C(CF_3)_2OH)CH_2$— or —$CH_2CH(CH_2C(CF_3)_2OH)$— is particularly preferred. Note, however, that the direction of the group means that the left side bonds to $CF_2=CR^1$—.

As a specific example of the compound represented by the formula $CF_2=CR^1$-Q-$CR^2=CH_2$, the following compounds are mentioned.

$CF_2=CFCH_2CH(C(CF_3)_2OH)CH_2CH=CH_2$,
$CF_2=CFCH_2CH(C(CF_3)_2OH)CH=CH_2$,
$CF_2=CFCH_2CH(C(CF_3)_2OH)CH_2CH_2CH=CH_2$,
$CF_2=CFCH_2CH(CH_2C(CF_3)_2OH)CH_2CH_2CH=CH_2$,
$CF_2=CFCH_2C(CH_3)(CH_2SO_2F)CH_2CH=CH_2$,
$CF_2=CFCF_2C(CF_3)(OCH_2OCH_3)CH_2CH=CH_2$,
$CF_2=CFCF_2C(CF_3)(OH)CH=CH_2$,
$CF_2=CFCF_2C(CF_3)(OH)CH_2CH=CH_2$,
$CF_2=CFCF_2C(CF_3)(OCH_2OCH_2CF_3)CH_2CH=CH_2$,
$CF_2=CFCF_2C(CF_3)(OCH_2OCH_3)CH_2CH=CH_2$,
$CF_2=CFOCF_2CF(O(CF_2)_3OC_2H_5)CH_2CH=CH_2$,
$CF_2=CFOCF_2CF(OCF_2CF_2CH_2NH_2)CH_2CH=CH_2$,
$CF_2=CFOCF_2CF(O(CF_2)_3CN)CH=CH_2$,
$CF_2=CFOCF_2CF(OCF_2CF_2SO_2F)CH_2CH=CH_2$,
$CF_2=CFOCF_2CF(O(CF_2)_3PO(OC_2H_5)_2)CH_2CH=CH_2$,
$CF_2=CFOCF_2CF(OCF_2CF_2SO_2F)CH_2CH=CH_2$ n in the compound represented by the formula $(CH_2=CXCOO)_nR^F$ is preferably 1 or 2. X is preferably a hydrogen atom or a methyl group. The carbon number of $R^F$ is particularly preferably from 4 to 24.

In a case where n is 1, $R^F$ is a monovalent fluorinated organic group. As the monovalent fluorinated organic group, a monovalent fluorinated organic group having a polyfluoroalkyl group which may have an etheric oxygen atom inserted between carbon atom-carbon atom, is preferred. As such a monovalent fluorinated organic group, a group represented by the formula —$(CH_2)_{f1}R^{F1}$, —$SO_2NR^4(CH_2)_{f1}R^{F1}$ or —$(C=O)NR^4(CH_2)_{f1}R^{F1}$ (wherein f1 is an integer of from 1 to 3, $R^{F1}$ is a $C_{4-16}$ polyfluoroalkyl group which may have an etheric oxygen atom inserted between carbon atom-carbon atom, and $R^4$ is a hydrogen atom, a methyl group or an ethyl group) is particularly preferred. As the polyfluoroalkyl group ($R^{F1}$), a perfluoroalkyl group is preferred, and a straight-chain perfluoroalkyl group is particularly preferred.

In a case where n is 2, $R^F$ is a bivalent fluorinated organic group. The bivalent fluorinated organic group is preferably a polyfluoroalkylene group which may have an etheric oxygen atom inserted between carbon atom-carbon atom, and a group represented by the formula —$(CH_2)_{f2}R^{F2}(CH_2)_{f3}$— (wherein each of f2 and f3 is an integer of from 1 to 3, and $R^{F2}$ is a $C_{4-16}$ polyfluoroalkylene group which may have an etheric oxygen atom inserted between carbon atom-carbon atom) is particularly preferred. As the polyfluoroalkylene group ($R^{F2}$), a perfluoroalkylene group is preferred, and a straight-chain perfluoroalkylene group and a perfluorooxyalkylene group having an etheric oxygen atom inserted between carbon atom-carbon atom and having a trifluoromethyl group on its side chain are particularly preferred.

As a specific example of the compound represented by the formula $(CH_2=CXCOO)_nR^F$, the following compounds are mentioned.

$CH_2=CHCOO(CH_2)_2(CF_2)_8F$,
$CH_2=CHCOO(CH_2)_2(CF_2)_6F$,
$CH_2=C(CH_3)COO(CH_2)_2(CF_2)_8F$,
$CH_2=C(CH_3)COO(CH_2)_2(CF_2)_6F$,
$CH_2=CHCOOCH_2(CF_2)_7F$,
$CH_2=C(CH_3)COOCH_2(CF_2)_7F$,
$CH_2=CHCOOCH_2CF_2CF_2H$,

CH$_2$=CHCOOCH$_2$(CF$_2$CF$_2$)$_4$H,
CH$_2$=C(CH$_3$)COOCH$_2$CF$_2$CF$_2$H,
CH$_2$=C(CH$_3$)COOCH$_2$(CF$_2$CF$_2$)$_4$H,
CH$_2$=CHCOOCH$_2$CF$_2$OCF$_2$CF$_2$OCF$_3$,
CH$_2$=CHCOOCH$_2$CF$_2$O(CF$_2$CF$_2$O)$_3$CF$_3$,
CH$_2$=C(CH$_3$)COOCH$_2$CF$_2$OCF$_2$CF$_2$OCF$_3$,
CH$_2$=C(CH$_3$)COOCH$_2$CF$_2$O(CF$_2$CF$_2$O)$_3$CF$_3$,
CH$_2$=CHCOOCH$_2$CF(CF$_3$)O(CF$_2$CF(CF$_3$)O)$_2$(CF$_2$)$_3$F,
CH$_2$=C(CH$_3$)COOCH$_2$CF(CF$_3$)O(CF$_2$CF(CF$_3$)O)$_2$(CF$_2$)$_3$F,
CH$_2$=CHCOOCH$_2$CF$_2$O(CF$_2$CF$_2$O)$_6$CF$_2$CH$_2$OCOCH=CH$_2$,
CH$_2$=C(CH$_3$)COOCH$_2$CF$_2$O(CF$_2$CF$_2$O)$_6$CF$_2$CH$_2$OCOC(CH$_3$)=CH$_2$,
CH$_2$=CHCOOCH$_2$(CF$_2$)$_4$CH$_2$OCOCH=CH$_2$,
CH$_2$=C(CH$_3$)COOCH$_2$(CF$_2$)$_4$CH$_2$OCOC(CH$_3$)=CH$_2$

The photocurable composition of the present invention contains a fluorinated surfactant and/or a fluoropolymer in an amount of from more than 0.1 to 20 mass %, preferably from 0.5 to 10 mass %, particularly preferably from 1 to 5 mass %. In such a case, the photocurable composition is readily prepared, and the photocurable composition can readily be formed into a cured product without undergoing a phase separation.

The photocurable composition may contain a fluorinated surfactant and a fluoropolymer, may contain a fluorinated surfactant only or may contain a fluoropolymer only. Further, in a case where the photocurable composition contains a fluorinated surfactant and a fluoropolymer, the above-mentioned content means the total amount of the fluorinated surfactant and the fluoropolymer.

As the fluorinated surfactant, one type of a fluorinated surfactant may be used, or at least two types of fluorinated surfactants may be used. Further, as the fluoropolymer, one type of a fluoropolymer may be used, or at least two types of fluoropolymers may be used.

In a case where the photocurable composition contains a fluorinated surfactant, the photocurable composition and a cured product of the photocurable composition are particularly excellent in releasability and can smoothly be separated from a mold. The photocurable composition preferably contains the fluorinated surfactant in an amount of from more than 0.1 to 5 mass %, particularly preferably from 0.5 to 2.5 mass %.

The fluorinated surfactant in the present invention is preferably a fluorinated surfactant having a fluorine content of from 10 to 70 mass %, particularly preferably a fluorinated surfactant having a fluorine content of from 20 to 40 mass %. The fluorinated surfactant may be water soluble or lipid soluble.

As the fluorinated surfactant, an anionic fluorinated surfactant, a cationic fluorinated surfactant, an amphoteric fluorinated surfactant or a nonionic fluorinated surfactant is preferred. A nonionic fluorinated surfactant is particularly preferred in view of its good dispersibility.

The anionic fluorinated surfactant is preferably a polyfluoroalkyl carboxylate, a polyfluoroalkyl phosphate or a trifluoroalkyl sulfonate. Specific examples of such a surfactant include Surflon S-111 (tradename, Seimi Chemical Company, Ltd.), Fluorade FC-143 (tradename, 3M Co.) and Megafac F-120 (tradename, Dainippon Ink & Chemicals Inc.).

The cationic fluorinated surfactant is preferably a trimethylammonium salt of a polyfluoroalkyl carboxylate or a trimethylammonium salt of a polyfluoroalkyl sulfonamide. Specific examples of such a surfactant include Surflon S-121 (tradename, Seimi Chemical Company, Ltd.), Fluorade FC-134 (tradename, 3M Co.) and Megafac F-450 (tradename, Dainippon Ink & Chemicals Inc.).

The amphoteric fluorinated surfactant is preferably a polyfluoroalkylbetaine. Specific examples of such a surfactant include Surflon S-132 (tradename, Seimi Chemical Company, Ltd.) and Fluorade FX-172 (tradename, 3M Co.).

The nonionic fluorinated surfactant may, for example, be a polyfluoroalkylamine oxide, a polyfluoroalkyl/alkylene oxide adduct, or an oligomer or a polymer which contains monomer units based on a monomer having a fluoroalkyl group. As the fluoroalkyl group, the above polyfluoroalkyl group ($R^{F1}$) is preferred. As the nonionic fluorinated surfactant, an oligomer or a polymer which contains monomer units based on a monomer having a fluoroalkyl group (mass average molecular weight of from 1,000 to 8,000) is preferred. As a monomer having a fluoroalkyl group, a fluoro(meth)acrylate is preferred, and a fluoroalkyl(meth)acrylate is particularly preferred. As the fluoroalkyl (meth)acrylate, a compound represented by the above formula (CH$_2$=CXCOO)$_n$R$^F$ wherein n is 1 and X is a hydrogen atom or a methyl group, is preferred.

Specific examples of the nonionic fluorinated surfactant include Surflon S-145 (tradename, Seimi Chemical Company, Ltd.), Surflon S-393 (tradename, Seimi Chemical Company, Ltd.), Surflon KH-20 (tradename, Seimi Chemical Company, Ltd.), Surflon KH-40 (tradename, Seimi Chemical Company, Ltd.), Fluorade FC-170 (tradename, 3M Co.), Fluorade FC-430 (tradename, 3M Co.), Megafac F-444 (tradename, Dainippon Ink & Chemicals Inc.) and Megafac F-479 (tradename, Dainippon Ink & Chemicals Inc.).

In a case where the photocurable composition contains a fluoropolymer, the photocurable composition and the cured product of the photocurable composition is excellent in releasability and can smoothly be separated from a mold. Further, in the polymerization of the photocurable composition, since the polymerization of monomers is carried out in the presence of a fluoropolymer, a cured product having a small volume shrinkage ratio can be obtained. Accordingly, the inverted pattern shape formed on the surface of the cured product is highly precise to the pattern shape of the mold. Note, however, that "fluoropolymer" in this specification means one except for an oligomer or polymer which contains monomer units based on a monomer having a fluoroalkyl group, mentioned as the nonionic fluorinated surfactant.

The photocurable composition preferably contains a fluoropolymer in an amount of from more than 0.1 to 10 mass %, more preferably from 0.5 to 7.5 mass %, particularly preferably from 1 to 5 masse.

The weight average molecular weight of the fluoropolymer is preferably from 500 to 100,000, more preferably from 1,000 to 100,000, particularly preferably from 3,000 to 50,000 in view of its compatibility with other components.

As the fluoropolymer, a fluoropolymer having a fluorine content of from 30 to 70 mass % is preferred, and a fluoropolymer having a fluorine content of from 45 to 70 mass % is particularly preferred in view of its excellent releasability.

Further, as the fluoropolymer, a fluoropolymer containing a heteroatom is preferred in view of compatibility, a fluoropolymer containing a nitrogen atom, an oxygen atom, a sulfur atom or a phosphorus atom is more preferred, and a fluoropolymer containing a hydroxyl group, an etheric oxygen atom, an ester group, an alkoxycarbonyl group, a sulfonyl group, a phosphate group, an amino group, a nitro group or a ketone group is particularly preferred.

As the fluoropolymer in the present invention, a fluoropolymer obtained by polymerizing a compound represented by the formula CF$_2$=CR$^1$-Q-CR$^2$=CH$_2$ and a fluoropolymer obtained by copolymerizing $CF_2=CF_2$ and $CH_2=CHOCOCH_3$ may be mentioned. Specific examples of a compound represented by the formula $CF_2=CR^1$-Q-$CR^2=CH_2$ include the above compounds.

As the fluoropolymer, a fluoropolymer obtained by polymerizing a compound represented by the formula $CF_2=CR^1$-Q-$CR^2=CH_2$ is preferred, and it is particularly preferred that $R^1$ is a fluorine atom, $R^2$ is a hydrogen atom and Q is a group selected from —$CF_2C(CF_3)(OH)CH_2$—, —$CF_2C(CF_3)(OH)$—, —$CF_2C(CF_3)(OCH_2OCH_3)CH_2$—, —$CH_2CH(CH_2C(CF_3)_2OH)CH_2$— and —$CH_2CH(CH_2C(CF_3)_2OH)$—.

Further, in the photocurable composition of the present invention, the amount of the fluoromonomer to the total amount of the fluorinated surfactant and the fluoropolymer is preferably from 1 to 100 times by mass, more preferably from 1 to 20 times by mass, particularly preferably from 1 to 10 times by mass.

The photocurable composition of the present invention contains a photopolymerization initiator in an amount of from 1 to 10 mass %, preferably from 2 to 9 mass %, particularly preferably from 3 to 8 mass %. By is setting it to such an amount, monomers in the photocurable composition can be readily polymerized to obtain a cured product, whereby an operation such as heating is unnecessary. Further, the residue in the photopolymerization initiator will not be likely to impair physical properties of the cured product. The photopolymerization initiator is a compound that causes a radical reaction or an ion reaction by light. As such a photopolymerization initiator, the following photopolymerization initiators may be mentioned.

As an acetophenone photopolymerization initiator, acetophenone, p-(tert-butyl)-1',1',1'-trichloroacetophenone, chloroacetophenone, 2',2'-diethoxyacetophenone, hydroxyacetophenone, 2,2-dimethoxy-2'-phenylacetophenone, 2-aminoacetophenone or dialkylaminoacetophenone may, for example, be mentioned.

As a benzoin photopolymerization initiator, benzyl, benzoin, benzoin methyl ether, benzoin ethyl ether, benzoin isopropyl ether, benzoin isobutyl ether, 1-hydroxycyclohexyl phenyl ketone, 2-hydroxy-2-methyl-1-phenyl-2-methylpropan-1-one, 1-(4-isopropylphenyl)-2-hydroxy-2-methylpropan-1-one or benzyl dimethyl ketal may, for example, be mentioned.

As a benzophenone photopolymerization initiator, benzophenone, benzoyl benzoate, methylbenzoyl benzoate, methyl-o-benzoyl benzoate, 4-phenyl benzophenone, hydroxybenzophenone, hydroxypropyl benzophenone, acryl benzophenone or 4,4'-bis(dimethylamino)benzophenone may, for example, be mentioned.

As a thioxanthone photopolymerization initiator, thioxanthone, 2-chlorothioxanthone, 2-methylthioxanthone, diethylthioxanthone or dimethylthioxanthone may, for example, be mentioned.

As a photopolymerization initiator containing a fluorine atom, perfluoro(tert-butyl peroxide) or perfluorobenzoyl peroxide may, for example, be mentioned.

As another photopolymerization initiator, α-acyloxime ester, benzyl-(o-ethoxycarbonyl)-α-monooxime, acylphosphine oxide, glyoxyester, 3-ketocoumarin, 2-ethyl anthraquionone, camphorquinone, tetramethylthiuram sulfide, azobisisobutylonitrile, benzoyl peroxide, dialkyl peroxide or tert-butyl peroxypivalate may, for example, be mentioned.

The photocurable composition of the present invention contains substantially no solvent. Since the photocurable composition of the present invention contains a specific monomer containing no fluorine atom, a fluorinated surfactant and a fluoromonomer having a high compatibility with a fluoropolymer, a composition can be formed uniformly without containing a solvent. Also, since no solvent is contained in the photocurable composition, it is possible to carry out photo-curing without carrying out other steps (e.g. a distillation step of the solvent) at the time of its use, and such an is effect is obtained that the volume shrinkage of the photocurable composition at the time of curing is small. "Containing substantially no solvent" means that no solvent is contained at all, or a solvent used in the preparation of the photocurable composition is removed as much as possible.

The photocurable composition of the present invention may contain a component (hereinafter referred to as another component) other than the base monomer, the fluoromonomer, the fluorinated surfactant, the fluoropolymer and the photopolymerization initiator. As such another component, a photosensitizer, an inorganic material, a carbon material, an electroconductive polymer, a dye material such as phthalocyanine, an organic metal complex such as porphyrin, an organic magnetic material, an organic semiconductor or a liquid crystal material may, for example, be mentioned.

As a specific example of the photosensitizer, n-butylamine, di-n-butylamine, tri-n-butyl phosphine, allylthiourea, s-benzylisothiuronium-p-toluene sulfinate, triethylamine, diethylaminoethyl methacrylate, triethylenetetramine or 4,4'-bis(dialkylamino)benzophenone may, for example, be mentioned.

As a specific example of the inorganic material, a silicon compound (silicon simple substance, silicon carbide, silicon dioxide, silicon nitride, silicon germanium, iron silicide or the like), a metal (platinum, gold, rhodium, nickel, silver, titanium, lanthanoid, copper, iron, zinc or the like), a metal oxide (titanium oxide, alumina, zinc oxide, ITO, iron oxide, copper oxide, bismuth oxide, manganese oxide, hafnium oxide, yttrium oxide, tin oxide, cobalt oxide, cerium oxide, silver oxide or the like), an inorganic compound salt (a ferroelectric material such as barium titanate, a piezoelectric material such as lead zirconate titanate, a battery material such as a lithium salt or the like) or a metal alloy (a magnetic material such as a ferrite magnet or a neodymium magnet, a semiconductor such as a bismuth/tellurium alloy or a gallium/arsenic alloy, a fluorescent material such as gallium nitride or the like) may, for example, be mentioned.

Specific examples of the carbon material include fullerene, carbon nanotube, carbon nanohorn, graphite, diamond and an active carbon.

The photocurable composition of the present invention is a composition which undergoes a curing reaction by light irradiation. A cured product obtained by curing the photocurable composition is preferably a micropattern-formed product. The photocurable composition of the present invention is preferably used as a photocurable composition which provides a micropattern-formed product obtained in such a manner that a mold having a micropattern on its surface is pressed against the photocurable composition to transfer the micropattern, followed by light irradiation to cure the photocurable composition to obtain a micropattern-formed product having an inverted pattern of the micropattern on its surface. The photocurable composition of the present invention may be cured while it is sandwiched and pressed between the micropattern surface of the mold and the surface of the substrate, or may be sandwiched and pressed the photocurable composition between the micropattern surface of the mold and the surface of the substrate, and then cured after the mold is separated.

The micropattern-formed product is made of a cured product of the photocurable composition (hereinafter sometimes referred simply as cured product), and it is present on the surface of the cured product thus formed or present on the surface of the substrate to which the cured product thus formed (projections, as mentioned below) is bonded. The former cured product thus formed may be laminated with the substrate (provided that the micropattern is present on the surface of the cured product other than the laminated side). "The micropattern-formed product integrated with the substrate" in the present invention means both a substrate to which the cured product thus formed is bonded, and a laminate of the cured product thus formed and a substrate.

The micropattern comprises a concavo-convex structure, and the concavo-convex structure is formed either by the cured product or by the cured product and the surface of the substrate. A concavo-convex structure formed by the cured product is a structure formed on the surface of the cured product, and a concavo-convex structure formed by the cured product and the surface of the substrate is a structure formed by many projections (made of the cured product) independently present on the surface of the substrate and the surface of the substrate free from such projections. In either case, the convex portions are made of the cured product of the photocurable composition. Further, the micropattern may have a structure wherein the above two structures co-exist at different positions on the surface of the substrate.

The convex portions in the micropattern structure or the projections (hereinafter both are referred to as convex portions) are present in the form of lines or dots on the surface of a cured product layer or the surface of the substrate, and the shapes of such lines or dots are not particularly limited. The line-form convex portions are not limited to linear lines, and may be curved lines or bent lines. Further, a number of such lines may be present in parallel with one another to form stripes. The cross-sectional shape of the line-form convex portions (shape of the cross section in a direction at right angles to the longitudinal direction of the lines) is not particularly limited, and it may, for example, be rectangular, trapezoidal, triangular or semi-circular. The shape of the dot-form convex portions is also not particularly limited. For example, it may be a columnar or conical shape with a bottom shape being rectangular, square, rhombic, hexagonal, triangular, circular or the like, a hemispherical shape or a polyhedral shape.

The average of widths (the widths of the bottom portions) of the line-form convex portions is preferably from 1 nm to 100 μm, particularly preferably from 10 nm to 10 μm. The average of lengths of the bottom faces of the dot-form convex portions is preferably from 1 nm to 100 μm, particularly preferably from 10 nm to 10 μm. However, in a case where the dots are elongated in a shape close to lines, the lengths of the bottom faces of the dot-form convex portions are meant for the lengths in a direction at right angles to the elongated direction, and in other cases, they are meant for the maximum lengths of the bottom face shapes. The average of heights of the line-form or dot-form convex portions is preferably from 1 nm to 100 μm, more preferably from 10 nm to 10 μm, further preferably from 10 nm to 2 μm, particularly preferably from 10 nm to 500 nm. Further, at a portion where the concavo-convex structure is densely present, the average of distance between adjacent convex portions (distance between the bottom portions) is preferably from 1 nm to 500 μm, more preferably from 10 nm to 50 μm, particularly preferably from 10 nm to 5 μm. Thus, the minimum dimension of such a convex structure is preferably at most 500 μm, more preferably at most 50 μm, further preferably at most 500 nm, particularly preferably at most 50 nm. Further, the lower limit thereof is preferably 1 nm. The minimum dimension is meant for the minimum one among the width, and height of the convex portions and distance between the convex portions. "Average interval of the convex portions" in the present invention means the average of the distance between adjacent convex portions at a portion where the convex portions are densely present.

The cured product obtained by curing the photocurable composition of the present invention preferably has a contact angle to water of preferably from 75 to 980, more preferably from 80 to 98°.

The volume shrinkage ratio at the time of polymerizing the photocurable composition of the present invention is preferably at most 20%.

The micropattern-formed product can be obtained by molding the photocurable composition by using a mold having a micropattern and photo-curing it. This "molding" means that the photocurable composition is brought into contact with the mold to transfer the micropattern present on the surface of the mold to the surface of the photocurable composition. Photo-curing of the photocurable composition may be carried out, after transferring the micropattern onto the surface of the photocurable composition, in a state where it is in contact with the mold or in non-contact with the mold. In the latter case, after transferring the micropattern onto the surface of the photocurable composition, the photocurable composition is separated from the mold, and photo-curing is carried out in a state where the micropattern on the surface of the photocurable composition is maintained. A process of carrying out photo-curing in a state where the photocurable composition is in contact with the mold will be hereinafter referred to as process 1 for production of a micropattern-formed product, and a process of carrying out photo-curing after separating the mold will be hereinafter referred to as process 2 for production of a micropattern-formed product.

(Process 1 for Production of a Micropattern-Formed Product)

Process 1 for production of a micropattern-formed product is a process for producing a micropattern-formed product, which comprises bringing the photocurable composition into contact with the micropatterned surface of a mold having a micropattern formed on the surface, photo-curing the photocurable composition in a state where it is in contact with the surface of the mold, and separating a cured product of the photocurable composition from the mold. More specifically, the following production process is preferred.

Namely, a process for producing a micropattern-formed product, which comprises carrying out the following steps A, B, C and as the case requires, step D, in this order using the photocurable composition of the present invention, a substrate and a mold having a micropattern on its surface to obtain a micropattern-formed product having a micropattern on its surface or such a micropattern-formed product integrated with the substrate:

step A: a step of sandwiching and pressing the photocurable composition between the surface of the substrate and the patterned surface of the mold;

step B: a step of curing the photocurable composition by light irradiation to obtain the micropattern-formed product comprising a cured product having the micropattern of the mold transferred on its surface;

step C: a step of separating at least one of the mold and the substrate from the cured product to obtain a micropattern-formed product, a micropattern-formed product integrated with the substrate or a micropattern-formed product integrated with the mold; and step D: a step of separating the micropattern-formed product from the mold in a case where the micropattern-formed product integrated with the mold is obtained in the step C.

The substrate in the production process 1 may be a flat substrate or a curved substrate. As such a substrate, a substrate made of an inorganic material such as silicon wafer, glass, quartz glass or a metal; or a substrate made of an organic material such as a fluororesin, a silicone resin, an acrylic resin or a polycarbonate resin, may be mentioned. Further, a substrate of which adhesion to the photocurable composition is improved by a surface treatment (silane coupling treatment, silazane treatment or the like), may be used.

The mold has a micropattern on its surface. The micropattern of the mold is an inverted pattern of a concavo-convex structure in the micropattern of the micropattern-formed product (namely, concaves are convexes and convexes are concaves). The micropattern of the mold has a concavo-convex structure corresponding to the micropattern of the micropattern-formed product. Namely, the shape of convex portions of the micropattern of the micropattern-formed product corresponds to the shape of concavo portions of the mold. The shape and the dimension of the concavo portions of the micropattern of the mold correspond to the shape and the dimension of the micropattern of the micropattern-formed product. Note, however, that the depth of concavo portions of the micropattern of the mold (corresponding to the height of convex portions of the micropattern of the micropattern-formed product) may be different from the height of the convex portions of the micropattern of the mold in some cases. Including such a case, the minimum dimension in a concavo structure in the micropattern of the mold is preferably at most 500 μm, more preferably at most 50 μm, further preferably at most 500 nm, particularly preferably at most 50 nm. Further, the lower limit is preferably 1 nm. The photocurable composition of the present invention can form a cured product with the micropattern transferred precisely, even when the micropattern of the mold is so fine.

As the mold in the production process 1, a mold made of a non-transmissive material such as silicon wafer, SiC or mica; or a mold made of a transmissive material such as glass, polydimethyl siloxane or a transparent fluororesin, may be mentioned. In the production process 1, a substrate made of a transmissive material or a mold made of a transmissive material is used.

As a specific embodiment of step A, the following steps A1, A2 and A3 may be mentioned.

Step A1: a step of disposing the photocurable composition on the surface of the substrate, and sandwiching and pressing the photocurable composition between the substrate and the mold so that the photocurable composition is in contact with the patterned surface of the mold.

Step A2: a step of disposing the photocurable composition on the patterned surface of the mold, and sandwiching and pressing the photocurable composition between the substrate and the mold so that the photocurable composition is in contact with the surface of the substrate.

Step A3: a step of combining the substrate and the mold to form a gap between the surface of the substrate and the patterned surface of the mold, filling the gap with the photocurable composition, and sandwiching and pressing the photocurable composition between the patterned surface of the mold and the substrate.

The disposition of the photocurable composition in step A1 is preferably carried out by coating the surface of the substrate with the photocurable composition by means of a method such as a potting method, a spin coating method, a roll coating method, a casting method, a dip coating method, a die coating method, a Langmuir Blodgett method or a vacuum vapor deposition method. The photocurable composition may be coated on the entire surface of the substrate, or may be coated on a part of the substrate. The pressing pressure (gauge pressure) at the time of pressing the substrate and the mold is preferably from more than 0 to 10 MPa, more preferably from 0.1 to 5 MPa.

The disposition of the photocurable composition in step A2 is preferably carried out by coating the patterned surface of the mold with the photocurable composition by means of a method such as a potting method, a spin coating method, a roll coating method, a casting method, a dip coating method, a die coating method, a Langmuir Blodgett method or a vacuum vapor deposition method. The photocurable composition may be coated on the entire surface of the patterned surface, or may be coated on a part of the patterned surface. The pressing pressure (gauge pressure) at the time of pressing the substrate and the mold is preferably from more than 0 to 10 MPa, more preferably from 0.1 to 5 MPa.

In step A3, as a method of filling the gap with the photocurable composition, a method of sucking the photocurable composition in the gap by a capillary action may be mentioned.

In the polymerization of the monomer by light irradiation in step B, in a case where a mold made of a transmissive material is employed, a method of irradiation with a light from the mold side is preferred, and in a case where a substrate made of a transmissive material is employed, a method of irradiation with a light from the substrate side is preferred. The wavelength of the light is preferably from 200 to 400 nm.

Since the photocurable composition of the present invention has a low viscosity and a high curing property, it is preferred to carry out step A or step B at a low temperature (preferably from 0 to 60° C.). Further, since a cured product of the photocurable composition has a high releasability and can be separated smoothly from a is mold, it is preferred to carry out step C or step D at a low temperature (preferably from 0 to 60° C.). Accordingly, it is possible that the entire process of the production process 1 of the present invention is carried out at a low temperature (preferably from 0 to 60° C.), such being advantageous.

(Process 2 for Production of a Micropattern-Formed Product)

Process 2 for production of a micropattern-formed product is a process comprising bringing the photocurable composition into contact with the micropatterned surface of a mold having a micropattern formed on the surface, separating the mold to produce a molded product of the photocurable composition having the micropattern of the mold transferred on its surface, and photo-curing the molded product of the photocurable composition. More specifically, the following production process is preferred.

Namely, it is a process for producing a micropattern-formed product, which comprises carrying out the following steps E, F, G and as the case requires, step H, in this order using the photocurable composition of the present invention, a substrate and a mold having a micropattern on its surface to obtain a micropattern-formed product having a micropattern on its surface or such a micropattern-formed product integrated with the substrate:

step E: a step of pressing the photocurable composition between the surface of the substrate and the patterned surface of the mold;

step F: a step of separating the mold from the photocurable composition to obtain a molded product of the photocurable composition having the micropattern of the mold transferred on its surface, integrated with the substrate;

step G: a step of curing the molded product of the photocurable composition by light irradiation to obtain a micropattern-formed product comprising a cured product having the micropattern of the mold transferred on its surface, integrated with the substrate; and step H: a step of separating the micropattern-formed product from the substrate.

As the mold and the substrate in the production process 2, the same mold and substrate in the production process 1 may be used. Further, the shape of the mold to be used in the production process 2 may be a roller type.

Since the photocurable composition of the present invention has a low viscosity and a high curing property, it is preferred to carry out step E or step F at a low temperature (preferably from 0 to 60° C.). Further, since a cured product of the photocurable composition has a high releasability and can be separated smoothly from a mold, it is preferred to carry out step G or step H at a low temperature (preferably from 0 to 60° C.).

Accordingly, it is possible that the entire process of the production process 2 of the present invention can be carried out at a low temperature (preferably from 0 to 60° C.), such being advantageous.

The micropattern-formed product obtained by the production process of the present invention is preferably a micropattern-formed product in which micro-projections made of a cured product of the photocurable composition of the present invention forming a micropattern are disposed on the surface of the substrate. The micropattern-formed product is excellent in physical properties such as heat resistance, chemical resistance, releasability or optical characteristics (transparency or low refractive index).

The micropattern-formed product obtained by the production process of the present invention has a micropattern of a mold highly precisely transferred on its surface. The micropattern-formed product is useful as an optical element such as a microlens array, an optical waveguide element, an optical switching element, a fresnel zone plate element, a binary optical element, a blaze optical element or a photonics crystal; an anti-reflection component, a biochip component, a microreactor chip component, a carrier component for catalyst, a recording medium, a display material, a filter, a sensor component, etc.

EXAMPLES

Now, the present invention will be explained in further detail with reference to Examples and Comparative Examples, but the present invention is by no means restricted thereto.

As a high-pressure mercury lamp, a high-pressure mercury lamp having dominant wavelengths of 255, 315 and 365 nm in 1.5 to 2.0 kHz was used.

As a base monomer, the following compound n1 (viscosity: 18 mPa·s) or the following compound n2 (viscosity: 17 mPa·s) was used, and the following compound f1 (viscosity: 4.2 mPa·s) was used as a fluoromonomer.

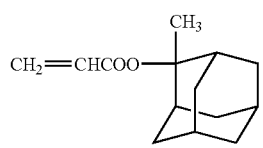

(n1)

$CH_2{=}CHCOO(CH_2CH_2O)_4COCH{=}CH_2$ (n2)

$CH_2{=}CHCOOCH_2CH_2(CF_2)_6F$ (f1)

As a polymerization initiator, a photopolymerization initiator (trade name: IRGACURE 651, manufactured by Ciba Specialty Chemicals) was used.

As a fluorinated surfactant, a co-oligomer (fluorine content of about 30 mass % and weight average molecular weight of 3,000) of a fluoroacrylate ($CH_2{=}CHCOO(CH_2)_2$ $(CF_2)_8F$) as a nonionic surfactant was used.

As a fluoropolymer, a fluoropolymer (fluorine content of 56.3 mass % and weight average molecular weight of 4,800) containing monomer units represented by the following formula (I) obtained by homopolymerizing $CF_2{=}CFCF_2C$ $(CF_3)(OH)CH_2CH{=}CH_2$ was used.

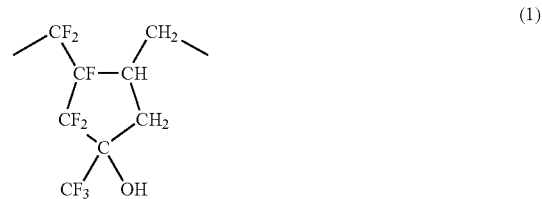

(1)

The volume shrinkage ratio is a value determined as a percentage of $((L^1-L^2)/L^1)$ in a case where the photocurable composition is encapsulated to a height $L^1$ in a test tube (made of glass) at 25° C., and is irradiated with a high-pressure mercury lamp (light source having dominant wavelengths of 255, 315 and 365 nm in 1.5 to 2.0 kHz) for 15 seconds to form a cured product having a height $L^2$. The contact angle indicates a contact angle to water.

The releasability of the cured product of the photocurable composition was evaluated as follows. The photocurable composition was dropped on the center portion of a slide glass, and another slide glass was overlapped thereon. Then, the photocurable composition was cured by irradiation with a high-pressure mercury lamp for 15 seconds, and then the slide glass was separated to confirm releasability. When the slide glass was separated by hand, it was evaluated as ⊚; when the slide glass was separated by a flat-head screwdriver, it was evaluated as ○; and when the slide glass was not separated even when a flat-head screwdriver was used, it was evaluated as X.

Example 1

Example for Production of Roller Type Mold

On a silicon wafer, a sheet of 2 cm in length and width (film thickness: 100 μm) made of a transparent fluororesin (tradename: Cytop manufactured by Asahi Glass Company, Limited) was laminated. Then, the silicon wafer was heated to 160° C., and the surface of the laminated sheet on the silicon wafer were contacted with the concavo-structured side of a silicon mold which has a plurality of concavo structures (width: 60 nm, depth: 100 nm, length: 5 nm, and average interval of concavo portions: 75 nm) formed on its surface, and pressed under 10 MPa (gauge pressure).

After cooling the silicon wafer to 25° C., the mold and the silicon wafer were separated to obtain a silicon wafer having a sheet made of a transparent fluororesin laminated, on the surface of which a plurality of convex structures (width: 60 nm, depth: 100 nm, length: 5 nm, and average interval of concavo portions: 75 nm) which are the inverted patterns of the concavo portions, are formed. Then, the sheet was wound on a cylindrical glass rod having a diameter of 1.6 cm, and the edge of the wound portion was taped by an adhesive tape to obtain a roller type mold having a plurality of convex portions (width: 60 nm, height: 100 nm, length: 5 mm, and average interval of convex portions: 75 nm) on its surface.

Example 2

Example for Preparation of Photocurable Composition

Example 2-1

Example for Preparation of Composition 1

Into a vial container (volume: 6 ml), 1.16 g of compound n1, 0.83 g of compound n2, 1.08 g of compound f1 and 0.08 g of the fluoropolymer were charged, and 0.11 g of the photopolymerization initiator was charged therein and mixed to obtain a photocurable composition having a viscosity of 22 mPa·s (composition 1). A volume shrinkage ratio of the composition 1 was 4%, and a contact angle of a cured product of the composition 1 was 75°.

Example 2-2

Example for Preparation of Composition 2

Into a vial container (volume: 6 ml), 1.16 g of compound n1, 0.83 g of compound n2, 1.08 g of compound f1, 0.08 g of the fluoropolymer and 0.03 g of the fluorinated surfactant were charged, and 0.11 g of the photopolymerization initiator was charged therein and mixed to obtain a photocurable composition having a viscosity of 24 mPa·s (composition 2). A volume shrinkage ratio of the composition 2 was 5%, and a contact angle of a cured product of the composition 2 was 82°.

Example 2-3

Example for Preparation of Composition 3

Into a vial container (volume: 6 ml), 0.30 g of compound n1, 0.40 g of compound n2, 0.25 g of compound f1 and 0.01 g of the fluorinated surfactant were charged, and 0.04 g of the photopolymerization initiator was charged therein and mixed to prepare a photocurable composition having a viscosity of 12 mPa·s (composition 3). A volume shrinkage ratio of the composition 3 was 9%, and a contact angle of a cured product of the composition 3 was 95°.

Example 2-4

Example for Preparation of Composition 4

Into a vial container (volume: 6 ml), 0.35 g of compound n1, 0.38 g of compound n2, 0.22 g of compound f1 and 0.01 g of the fluorinated surfactant were charged, and 0.04 g of the photopolymerization initiator was charged therein and mixed to prepare a photocurable composition having a viscosity of 12 mPa·s (composition 4). The volume shrinkage ratio of the composition 4 was 10%, and a contact angle of a cured product of the composition 4 was 940.

Example 2-5

Example for Preparation of Composition 5

Into a vial container (volume: 6 ml), 0.35 g of compound n1, 0.26 g of compound n2, 0.30 g of compound f1, 0.04 g of the fluoropolymer and 0.01 g of the fluorinated surfactant were charged, and 0.04 g of the photopolymerization initiator was charged therein and mixed to prepare a photocurable composition having a viscosity of 19 mPa·s (composition 5). A volume shrinkage ratio of the composition 5 was 5%, and a contact angle of a cured product of the composition 5 was 96°.

Example 2-6

Example for Preparation of Composition 6

Into a vial container (volume: 6 ml), 0.30 g of compound n1, 0.40 g of compound n2 and 0.25 g of compound f1 were charged, and 0.04 g of the photopolymerization initiator was charged therein and mixed to obtain a photocurable composition having a viscosity of 10 mPa·s (composition 6). A volume shrinkage ratio of the composition 6 was 11%, and a contact angle of a cured product of the composition 6 was 730.

Example 2-7

Example for Preparation of Composition 7

Into a vial container (volume: 6 ml), 0.36 g of compound n1, 0.59 g of compound n2 and 0.01 g of the fluorinated surfactant were charged, and 0.04 g of the photopolymerization initiator was charged therein and mixed. However, due to intense foaming and minute gel formation, the filtration property was significantly deteriorated, whereby no uniform composition was obtained.

Example 2-8

Example for Preparation of Composition 8

Into a vial container (volume: 6 ml), 0.17 g of compound n1, 0.28 g of compound n2, 0.50 g of compound f1 and 0.01 g of the fluorinated surfactant were charged, and 0.04 g of the photopolymerization initiator was charged therein and mixed. However, the photopolymerization initiator was not completely dissolved, whereby no uniform composition was obtained.

Example 2-9

Example for Preparation of Composition 9

Into a vial container (volume: 6 ml), 0.30 g of compound n1, 0.40 g of the following compound n3 (viscosity: 130 mPa·s), 0.25 g of compound f1 and 0.01 g of the fluorinated surfactant were charged, and 0.04 g of the photopolymerization initiator was charged therein and mixed. However, the whole mixture became clouded, and no uniform composition was obtained.

Compound n3: diurethane dimethacrylate (manufactured by Aldrich) represented by $R^1CH_2[C(CH_3)(R^5)CH_2]_2CH_2R^1$ (wherein $R^1$ indicates $—NHCO_2CH_2CH_2O_2CC(CH_3)=CH_2$, and $R^5$ indicates a hydrogen atom or a methyl group).

With regard to the compositions 1 to 9, the respective contents (mass %) of the monomer (compound n1, compound n2 and compound f1), the fluorinated surfactant, the fluoropolymer and the photopolymerization initiator are shown in Table 1. Further, evaluation results of the volume shrinkage ratio, the contact angle and the releasability of the compositions 1 to 9 are also shown in Table 1.

TABLE 1

|  | Composition 1 | Composition 2 | Composition 3 | Composition 4 | Composition 5 | Composition 6 | Composition 7 | Composition 8 | Composition 9 |
|---|---|---|---|---|---|---|---|---|---|
| Compound n1 | 35.6 | 35.4 | 30.0 | 35.0 | 35.0 | 30.3 | 35.6 | 16.8 | 30.0 |
| Compound n2 | 25.4 | 25.2 | 40.0 | 38.0 | 26.0 | 40.4 | 59.4 | 28.2 | 0.0 |
| Compound n3 | 0.0 | 0.0 | 0.0 | 0.0 | 0.0 | 0.0 | 0.0 | 0.0 | 40.0 |
| Compound f1 | 33.1 | 32.8 | 25.0 | 22.0 | 30.0 | 25.3 | 0.0 | 50.0 | 25.0 |
| Fluorinated surfactant | 0 | 0.9 | 1.0 | 1.0 | 1.0 | 0.0 | 1.0 | 1.0 | 1.0 |
| Fluoropolymer | 2.5 | 2.4 | 0.0 | 0.0 | 4.0 | 0.0 | 0.0 | 0.0 | 0.0 |
| Photopolymerization initiator | 3.4 | 3.3 | 4.0 | 4.0 | 4.0 | 4.0 | 4.0 | 4.0 | 4.0 |
| Volume shrinkage ratio | 4% | 5% | 9% | 10% | 5% | 11% | — | — | — |
| Contact angle | 75° | 82° | 95° | 94° | 96° | 73° | — | — | — |
| Releasabililty | ○ | ◎ | ◎ | ◎ | ◎ | X | — | — | — |

Example 3

Example for Production of Micropattern-Formed Product

Example 3-1

Example (1) for Production of Micropattern-Formed Product

At 25° C., a single droplet of the composition 1 was dropped on a silicon wafer to obtain a silicon wafer uniformly coated with the composition 1. Then, a mold made of quartz which has a plurality of concavo structures (width: 800 nm, depth: 180 nm, length 10 μm, and the average interval of concavo portions: 800 nm) on its surface, was pressed against the composition 1 side on the silicon wafer, followed by pressing under 0.5 MPa (gauge pressure).

Then, at 25° C., irradiation of a high-pressure mercury lamp was carried out for 15 seconds from the mold side to obtain a cured product of the composition 1. At 25° C., the mold was separated from the silicon wafer to obtain a micropattern-formed product having the cured product of the composition 1 having convex portions, which are the inverted patterns of the concavo portions of the mold, formed on the surface of the silicon wafer.

Example 3-2

Example (2) for Production of Micropattern-Formed Product

In the same manner as in Example 3-1 except for using the composition 2 instead of using the composition 1, a micropattern-formed product comprising a cured product of the composition 2 having convex portions on the surface, which are the inverted patterns of the concavo portions of the mold, formed on a silicon wafer, was obtained.

Example 3-3

Example (3) for Production of Micropattern-Formed Product

To the roller type mold obtained in Example 1, a cotton cloth impregnated with the composition 3 was pressed so as to coat the roller type mold with the composition 3. Then, the mold was rotated while it was pressed against the silicon wafer to transfer the composition 3 applied on the mold onto the silicon wafer. Hereupon, from above the silicon wafer, irradiation of a high-pressure mercury lamp was carried out for 15 seconds to cure the composition 3. As a result of analyzing the cured product of the composition 3 formed on the silicon wafer, a micropattern corresponding to concavo portions of the mold used in Example 1 was formed on the surface of the cured product.

INDUSTRIAL APPLICABILITY

According to the present invention, a micropattern-formed product having a cured product layer having a micropattern, which is useful as an optical element such as a microlens array, an optical waveguide element, an optical switching element, a fresnel zone plate, a binary optical element, a blaze optical element or a photonics crystal, an anti-reflection component, a biochip component, a microreactor chip component or a carrier for catalysts, can be produced efficiently.

The entire disclosures of Japanese Patent Application No. 2005-123583 filed on Apr. 21, 2005 and Japanese Patent Application No. 2005-186742 filed on Jun. 27, 2005 including specifications, claims, and summaries are incorporated herein by reference in their entireties.

What is claimed is:

1. A process for producing a micropattern-formed product, which comprises
   bringing a photocurable composition which comprises from 50 to 98 mass % of a monomer containing no fluorine atom and having a viscosity at 25° C. of from 0.1 to 100 mPa·s, from 0.1 to 45 mass % of a fluoromonomer, from more than 0.1 to 20 mass % of a fluorinated surfactant and/or a fluoropolymer and from 1 to 10 mass % of a photopolymerization initiator, and contains substantially no solvent, into contact with the micropatterned surface of a mold having a micropattern formed on the surface,
   photo-curing the photocurable composition in a state where it is in contact with the surface of the mold, and
   separating a cured product of the photocurable composition from the mold.

2. The process for producing a micropattern-formed product according to claim 1, wherein the micropattern of the mold is a micropattern having convex portions and concavo portions, and the average interval of the convex portions is from 1 nm to 500 μm.

3. The process of claim 1, wherein the photocurable composition comprises an adamantyl group-containing acrylate monomer unit and a polyoxyalkylene acrylate monomer unit.

4. The method of claim 1, wherein the photocurable composition comprises a fluoroacrylate monomer unit.

5. The method of claim 1, wherein the photocurable composition comprises a fluoropolymer surfactant.

6. The method of claim 5, wherein the fluoropolymer surfactant consists of C atoms, F atoms, H atoms, and O atoms.

7. A process for producing a micropattern-formed product, which comprises
carrying out the following steps A, B, C and as the case requires, step D, in this order with a photocurable composition comprising from 50 to 98 mass % of a monomer containing no fluorine atom and having a viscosity at 25° C. of from 0.1 to 100 mPa·s, from 0.1 to 45 mass % of a fluoromonomer, from more than 0.1 to 20 mass % of a fluorinated surfactant and/or a fluoropolymer and from 1 to 10 mass % of a photopolymerization initiator, and contains substantially no solvent, a substrate and a mold having a micropattern on its surface to obtain a micropattern-formed product having a micropattern on its surface or such a micropattern-formed product integrated with the substrate:
step A: a step of sandwiching and pressing the photocurable composition between the surface of the substrate and the patterned surface of the mold;
step B: a step of curing the photocurable composition by light irradiation to obtain a micropattern-formed product comprising a cured product having the micropattern of the mold transferred on its surface;
step C: a step of separating at least one of the mold and the substrate from the cured product to obtain a micropattern-formed product, a micropattern-formed product integrated with the substrate or a micropattern-formed product integrated with the mold; and
step D: a step of separating the micropattern-formed product from the mold in a case where the micropattern-formed product integrated with the mold is obtained in the step C.

8. The process of claim 7, wherein the photocurable composition comprises an adamantyl group-containing acrylate monomer unit and a polyoxyalkylene acrylate monomer unit.

9. The method of claim 7, wherein the photocurable composition comprises a fluoroacrylate monomer unit.

10. The method of claim 7, wherein the photocurable composition comprises a fluoropolymer surfactant.

11. The method of claim 7, wherein the fluoropolymer surfactant consists of C atoms, F atoms, H atoms, and O atoms.

12. A process for producing a micropattern-formed product, which comprises
bringing a photocurable composition which comprises from 50 to 98 mass % of a monomer containing no fluorine atom and having a viscosity at 25° C. of from 0.1 to 100 mPa·s, from 0.1 to 45 mass % of a fluoromonomer, from more than 0.1 to 20 mass % of a fluorinated surfactant and/or a fluoropolymer and from 1 to 10 mass % of a photopolymerization initiator, and contains substantially no solvent, into contact with the micropatterned surface of a mold having a micropattern formed on the surface,
separating the mold to produce a molded product of the photocurable composition having the micropattern of the mold transferred on its surface, and
photo-curing the molded product of the photocurable composition.

13. The process of claim 12, wherein the photocurable composition comprises an adamantyl group-containing acrylate monomer unit and a polyoxyalkylene acrylate monomer unit.

14. The method of claim 12, wherein the photocurable composition comprises a fluoroacrylate monomer unit.

15. The method of claim 12, wherein the photocurable composition comprises a fluoropolymer surfactant.

16. The method of claim 12, wherein the fluoropolymer surfactant consists of C atoms, F atoms, H atoms, and O atoms.

17. A process for producing a micropattern-formed product, which comprises carrying out the following steps E, F, G and as the case requires, step H, in this order with a photocurable composition comprising from 50 to 98 mass % of a monomer containing no fluorine atom and having a viscosity at 25° C. of from 0.1 to 100 mPa·s, from 0.1 to 45 mass % of a fluoromonomer, from more than 0.1 to 20 mass % of a fluorinated surfactant and/or a fluoropolymer and from 1 to 10 mass % of a photopolymerization initiator, and contains substantially no solvent, a substrate and a mold having a micropattern on its surface to obtain a micropattern-formed product having a micropattern on its surface or such a micropattern-formed product integrated with the substrate:
step E: a step of pressing the photocurable composition between the surface of the substrate and the patterned surface of the mold;
step F: a step of separating the mold from the photocurable composition to obtain a molded product of the photocurable composition having the micropattern of the mold transferred on its surface, integrated with the substrate;
step G: a step of curing the molded product of the photocurable composition by light irradiation to obtain a micropattern-formed product comprising a cured product having the micropattern of the mold transferred on its surface, integrated with the substrate; and
step H: a step of separating the micropattern-formed product from the substrate.

18. The process for producing a micropattern-formed product according to claim 17, wherein the micropattern of the mold is a micropattern having convex portions and concavo portions, and the average interval of the convex portions is from 1 nm to 500 μm.

19. The process of claim 17, wherein the photocurable composition comprises an adamantyl group-containing acrylate monomer unit and a polyoxyalkylene acrylate monomer unit.

20. The method of claim 17, wherein the photocurable composition comprises a fluoroacrylate monomer unit.

21. The method of claim 17, wherein the photocurable composition comprises a fluoropolymer surfactant.

22. The method of claim 17, wherein the fluoropolymer surfactant consists of C atoms, F atoms, H atoms, and O atoms.

* * * * *